(12) United States Patent
Chen et al.

(10) Patent No.: US 9,831,088 B2
(45) Date of Patent: Nov. 28, 2017

(54) COMPOSITION AND PROCESS FOR SELECTIVELY ETCHING METAL NITRIDES

(75) Inventors: Tianniu Chen, Rocky Hill, CT (US); Nicole E. Thomas, Marlborough, MA (US); Steven Lippy, Brookfield, CT (US); Jeffrey A. Barnes, Bethlehem, CT (US); Emanuel I. Cooper, Scarsdale, NY (US); Peng Zhang, Montvale, NJ (US)

(73) Assignee: ENTEGRIS, INC., Billerica, MA (US)

( * ) Notice: Subject to any disclaimer, the term of this patent is extended or adjusted under 35 U.S.C. 154(b) by 212 days.

(21) Appl. No.: 13/877,777

(22) PCT Filed: Oct. 6, 2011

(86) PCT No.: PCT/US2011/055049
§ 371 (c)(1),
(2), (4) Date: Oct. 23, 2013

(87) PCT Pub. No.: WO2012/048079
PCT Pub. Date: Apr. 12, 2012

(65) Prior Publication Data
US 2014/0038420 A1    Feb. 6, 2014

Related U.S. Application Data

(60) Provisional application No. 61/390,372, filed on Oct. 6, 2010.

(51) Int. Cl.
| | |
|---|---|
| H01L 21/461 | (2006.01) |
| H01L 21/28 | (2006.01) |
| B81C 1/00 | (2006.01) |
| H01L 21/3213 | (2006.01) |
| H01L 21/8238 | (2006.01) |

(52) U.S. Cl.
CPC .... *H01L 21/28088* (2013.01); *B81C 1/00539* (2013.01); *H01L 21/28079* (2013.01); *H01L 21/32134* (2013.01); *H01L 21/823842* (2013.01)

(58) Field of Classification Search
CPC ......... H01L 21/32134; H01L 21/28079; H01L 21/28088; B81C 1/00539
USPC ................. 438/750, 754; 216/100, 108, 109
See application file for complete search history.

(56) References Cited

U.S. PATENT DOCUMENTS

| | | |
|---|---|---|
| 3,559,281 A | 2/1971 | Mayberry et al. |
| 3,923,567 A | 12/1975 | Lawrence |
| 4,163,727 A | 8/1979 | Inks |
| 4,226,932 A | 10/1980 | Ferraris |
| 4,410,396 A | 10/1983 | Somers et al. |
| 4,704,188 A | 11/1987 | Carlson et al. |
| 5,320,709 A | 6/1994 | Bowden et al. |
| 5,622,875 A | 4/1997 | Lawrence |
| 5,665,168 A | 9/1997 | Nakano et al. |
| 5,705,089 A | 1/1998 | Sugihara et al. |
| 5,803,956 A | 9/1998 | Ohmi et al. |
| 5,855,735 A | 1/1999 | Takada et al. |
| 5,976,928 A | 11/1999 | Kirlin et al. |
| 5,993,685 A | 11/1999 | Currie et al. |
| 6,136,711 A | 10/2000 | Grumbine et al. |
| 6,140,211 A | 10/2000 | Nanda et al. |
| 6,140,239 A | 10/2000 | Avanzino et al. |
| 6,194,366 B1 | 2/2001 | Naghshineh et al. |
| 6,211,126 B1 | 4/2001 | Wojtczak et al. |
| 6,224,785 B1 | 5/2001 | Wojtczak et al. |
| 6,235,693 B1 | 5/2001 | Cheng et al. |
| 6,280,651 B1 | 8/2001 | Wojtczak et al. |
| 6,284,628 B1 | 9/2001 | Kuwahara et al. |
| 6,306,807 B1 | 10/2001 | Wojtczak et al. |
| 6,322,600 B1 | 11/2001 | Brewer et al. |
| 6,323,168 B1 | 11/2001 | Kloffenstein et al. |
| 6,323,169 B1 | 11/2001 | Abe et al. |
| 6,344,432 B1 | 2/2002 | Wojtczak et al. |
| 6,395,194 B1 | 5/2002 | Russell et al. |
| 6,406,923 B1 | 6/2002 | Inoue et al. |
| 6,409,781 B1 | 6/2002 | Wojtczak et al. |
| 6,432,836 B1 | 8/2002 | Watanabe |
| 6,465,403 B1 | 10/2002 | Skee |
| 6,492,308 B1 | 12/2002 | Naghshineh et al. |
| 6,527,819 B2 | 3/2003 | Wojtczak et al. |
| 6,531,404 B1 | 3/2003 | Nallan et al. |
| 6,547,647 B2 | 4/2003 | Chang |

(Continued)

FOREIGN PATENT DOCUMENTS

| | | |
|---|---|---|
| JP | 55109498 A | 8/1980 |
| JP | 58055323 A | 4/1983 |

(Continued)

OTHER PUBLICATIONS

Chemical Book, "1-Hydroxyethylidene-1,1-diphosphonic acid" via http://www.chemicalbook.com/ProductChemicalPropertiesCB4719658_EN.htm ; 1 page; 2008.*
Wikipedia, The Free Encyclopedia, "Oxidizing agent" via https://web.archive.org/web/20090226192259/http://en.wikipedia.org/wiki/Oxidizing_agent ; 3 pages; 2009.*
What is Corrosion? via https://www.thebalance.com/what-is-corrosion-2339700 ; 13 pages; No date.*
Chung, B. C., et al., The Prevention of Si Pitting in Hydrofluoric Acid Cleaning by Additions of Hydrochloric Acid, J. Electrochem. Soc., Feb. 1997, pp. 652-657, vol. 144, No. 2.
International Search Report, May 8, 2012.
European Patent Office, Partial European Search Report, dated Feb. 7, 2011.

*Primary Examiner* — Binh X Tran

(57) ABSTRACT

A removal composition and process for selectively removing a first metal gate material (e.g., titanium nitride) relative to a second metal gate material (e.g., tantalum nitride) from a microelectronic device having said material thereon. The removal composition can include fluoride or alternatively be substantially devoid of fluoride. The substrate preferably comprises a high-k/metal gate integration scheme.

12 Claims, No Drawings

(56) References Cited

U.S. PATENT DOCUMENTS

| | | |
|---|---|---|
| 6,566,315 B2 | 5/2003 | Wojtczak et al. |
| 6,627,587 B2 | 9/2003 | Naghshineh et al. |
| 6,692,546 B2 | 2/2004 | Ma et al. |
| 6,693,047 B1 | 2/2004 | Lu et al. |
| 6,706,636 B2 | 3/2004 | Matsukawa |
| 6,723,691 B2 | 4/2004 | Naghshineh et al. |
| 6,755,989 B2 | 6/2004 | Wojtczak et al. |
| 6,761,625 B1 | 7/2004 | Rojhantalab et al. |
| 6,762,132 B1 | 7/2004 | Yates |
| 6,770,426 B1 | 8/2004 | Vaartstra |
| 6,773,873 B2 | 8/2004 | Seijo et al. |
| 6,800,218 B2 | 10/2004 | Ma et al. |
| 6,802,983 B2 | 10/2004 | Mullee et al. |
| 6,869,921 B2 | 3/2005 | Koito et al. |
| 6,875,733 B1 | 4/2005 | Wojtczak et al. |
| 6,896,826 B2 | 5/2005 | Wojtczak et al. |
| 6,974,764 B2 | 12/2005 | Brask et al. |
| 7,029,373 B2 | 4/2006 | Ma et al. |
| 7,119,052 B2 | 10/2006 | Korzenski et al. |
| 7,163,852 B2 | 1/2007 | Monoe et al. |
| 7,208,325 B2 | 4/2007 | Wang et al. |
| 7,211,479 B2 | 5/2007 | Tang et al |
| 7,300,601 B2 | 11/2007 | Liu et al. |
| 7,311,857 B2 | 12/2007 | Ko et al. |
| 7,335,239 B2 | 2/2008 | Baum |
| 7,365,045 B2 | 4/2008 | Walker et al. |
| 7,390,847 B2 | 6/2008 | Gonzalez et al. |
| 7,521,407 B2 | 4/2009 | Tamura |
| 7,534,752 B2 | 5/2009 | Wojtczak et al. |
| 8,163,655 B2 | 4/2012 | Chang |
| 2002/0139055 A1 | 10/2002 | Asano et al. |
| 2004/0009883 A1 | 1/2004 | Ikemoto et al. |
| 2004/0029395 A1 | 2/2004 | Zhang et al. |
| 2004/0050406 A1 | 3/2004 | Sehgal |
| 2004/0180300 A1 | 9/2004 | Minsek et al. |
| 2004/0220065 A1 | 11/2004 | Hsu |
| 2004/0229461 A1 | 11/2004 | Darsillo et al. |
| 2005/0076580 A1 | 4/2005 | Tamboli et al. |
| 2005/0081885 A1 | 4/2005 | Zhang et al. |
| 2005/0100833 A1 | 5/2005 | Anzures et al. |
| 2005/0176603 A1 | 8/2005 | Hsu |
| 2005/0197265 A1 | 9/2005 | Rath et al. |
| 2005/0205515 A1 | 9/2005 | Saga et al. |
| 2006/0009011 A1 | 1/2006 | Barrett et al. |
| 2006/0036368 A1 | 2/2006 | Chen et al. |
| 2006/0154186 A1 | 7/2006 | Minsek et al. |
| 2006/0154484 A1 | 7/2006 | Hwang et al. |
| 2006/0166847 A1 | 7/2006 | Walker et al. |
| 2006/0199749 A1 | 9/2006 | Suzuki et al. |
| 2006/0226122 A1 | 10/2006 | Wojtczak et al. |
| 2006/0234516 A1 | 10/2006 | Hong et al. |
| 2006/0249482 A1 | 11/2006 | Wrschka et al. |
| 2007/0007241 A1 | 1/2007 | DeLouise |
| 2007/0015321 A1 | 1/2007 | Monoe et al. |
| 2007/0060490 A1 | 3/2007 | Skee |
| 2007/0082497 A1 | 4/2007 | Lee et al. |
| 2007/0087580 A1 | 4/2007 | Kang et al. |
| 2007/0251551 A1 | 11/2007 | Korzenski et al. |
| 2008/0006305 A1 | 1/2008 | Bernhard et al. |
| 2008/0038932 A1 | 2/2008 | Wagner |
| 2008/0076688 A1 | 3/2008 | Barnes et al. |
| 2008/0124930 A1 | 5/2008 | Lim et al. |
| 2008/0125342 A1 | 5/2008 | Visintin et al. |
| 2008/0214006 A1 | 9/2008 | Lee et al. |
| 2008/0242574 A1 | 10/2008 | Rath et al. |
| 2008/0261847 A1 | 10/2008 | Visintin et al. |
| 2008/0286701 A1 | 11/2008 | Rath et al. |
| 2008/0318426 A1 | 12/2008 | Kim et al. |
| 2009/0032766 A1 | 2/2009 | Rajaratnam et al. |
| 2009/0111269 A1 | 4/2009 | Yu et al. |
| 2009/0118153 A1 | 5/2009 | Rath et al. |
| 2009/0212021 A1 | 8/2009 | Bernhard et al. |
| 2009/0215658 A1 | 8/2009 | Minsek et al. |
| 2009/0281016 A1 | 11/2009 | Cooper et al. |
| 2010/0206841 A2 | 8/2010 | Ko et al. |
| 2010/0216315 A1* | 8/2010 | Yaguchi et al. ............... 438/745 |
| 2010/0301427 A1* | 12/2010 | Lenski et al. ................. 257/392 |
| 2011/0147341 A1* | 6/2011 | Sato et al. ...................... 216/13 |

FOREIGN PATENT DOCUMENTS

| | | |
|---|---|---|
| JP | 61040805 A | 2/1986 |
| JP | 1183824 A | 7/1989 |
| JP | 1272785 A | 10/1989 |
| JP | 05299810 A | 11/1993 |
| JP | 11067632 A | 3/1999 |
| JP | 11074180 A | 3/1999 |
| JP | 11150329 A | 6/1999 |
| JP | 11265867 A | 9/1999 |
| JP | 2002025968 A | 1/2002 |
| JP | 2002075959 A | 3/2002 |
| JP | 2003077899 A | 3/2003 |
| JP | 2003124174 A | 4/2003 |
| JP | 2003338484 A | 11/2003 |
| JP | 2004170538 A | 6/2004 |
| JP | 2004200378 A | 7/2004 |
| JP | 2004219486 A | 8/2004 |
| JP | 2004296593 A | 10/2004 |
| JP | 2004354649 A | 12/2004 |
| JP | 2008512862 A | 4/2008 |
| JP | 2008112892 A | 5/2008 |
| TW | 200704828 A | 2/2007 |
| TW | 201013751 A1 | 4/2010 |
| WO | 2006023061 A1 | 3/2006 |
| WO | 2006110645 A2 | 10/2006 |
| WO | 2006138235 A2 | 12/2006 |
| WO | 2007027522 A2 | 3/2007 |
| WO | 2007092800 A2 | 8/2007 |
| WO | 2008036823 A2 | 3/2008 |
| WO | 2008039730 A1 | 4/2008 |
| WO | 2008080096 A2 | 7/2008 |
| WO | 2008080097 A2 | 7/2008 |
| WO | WO 2008080096 A2 * | 7/2008 ............ C09K 13/08 |
| WO | 2008095078 A1 | 8/2008 |
| WO | 2008098034 A1 | 8/2008 |
| WO | 2008098593 A1 | 8/2008 |
| WO | 2008144501 A2 | 11/2008 |
| WO | 2008157345 A2 | 12/2008 |
| WO | 2009014144 A1 | 1/2009 |
| WO | 2009026324 A2 | 2/2009 |
| WO | 2009032460 A1 | 3/2009 |
| WO | 2009073596 A2 | 6/2009 |
| WO | 2009111719 A9 | 9/2009 |
| WO | WO 2010029867 A1 * | 3/2010 |
| WO | 2012009639 A2 | 1/2012 |

* cited by examiner

COMPOSITION AND PROCESS FOR SELECTIVELY ETCHING METAL NITRIDES

CROSS-REFERENCE TO RELATED APPLICATIONS

This application is filed under the provisions of 35 U.S.C. §371 and claims the priority of International Patent Application No. PCT/US2011/055049 filed on 6 Oct. 2011 entitled "COMPOSITION AND PROCESS FOR SELECTIVELY ETCHING METAL NITRIDES" in the name of Tianniu CHEN, et al, which claims priority to U.S. Provisional Patent Application No. 61/390,372, filed on 6 Oct. 2010, both of which are hereby incorporated by reference herein in their entirety.

FIELD

The present invention relates to compositions and methods for selectively removing one metal gate material relative to a second metal gate material from a substrate comprising same. The substrate preferably comprises a high-k/metal gate integration scheme.

DESCRIPTION OF THE RELATED ART

The majority of present day integrated circuits (ICs) are implemented by using a plurality of interconnected field effect transistors (FETs), also called metal oxide semiconductor field effect transistors (MOSFETs or MOS transistors). An MOS transistor includes a gate electrode as a control electrode overlying a semiconductor substrate and spaced-apart source and drain regions in the substrate between which a current can flow. A gate insulator is disposed between the gate electrode and the semiconductor substrate to electrically isolate the gate electrode from the substrate. A control voltage applied to the gate electrode controls the flow of current through a channel in the substrate underlying the gate electrode between the source and drain regions. There is a continuing trend to incorporate more and more circuitry on a single IC chip. To incorporate the increasing amount of circuitry, the size of each individual device in the circuit and the size and spacing between device elements (the feature size) must decrease.

To achieve scaling of semiconductor devices, a variety of unconventional, sensitive, and/or exotic materials are being contemplated. High dielectric constant materials, also referred to as "high-k dielectrics," such as hafnium dioxide ($HfO_2$), hafnium silicon oxynitride (HfSiON), or zirconium dioxide ($ZrO_2$), are considered for the 45 nm node technology and beyond to allow scaling of gate insulators. To prevent Fermi-level pinning, metal gates with the proper work function are used as gate electrodes on the high-k gate dielectrics. Such metal gate electrodes typically are formed of a metal gate-forming material such as lanthanum (La), aluminum (Al), magnesium (Mg), ruthenium (Ru), titanium-based materials such as titanium (Ti) and titanium nitride ($TiN_x$), tantalum-based materials such as tantalum (Ta) and tantalum nitride ($TaN_x$), titanium carbide ($Ti_2C$) or tantalum carbide ($Ta_2C$), or the like.

The optimal work function for a metal gate electrode will differ depending upon whether it is used to form an NMOS transistor or a PMOS transistor. For that reason, when the same material is used to make metal gate electrodes for NMOS and PMOS transistors, the gate electrodes cannot demonstrate the desired work function for both types of devices. It has been demonstrated that this problem can be eliminated by forming the NMOS transistor's metal gate electrode from a first material and the PMOS transistor's metal gate electrode from a second material. The first material may ensure an acceptable work function for the NMOS gate electrode, while the second material may ensure an acceptable work function for the PMOS gate electrode. Processes for forming such dual metal gate devices may, however, be complex and expensive. For example, the selective etching of the work functional metals such as $TiN_x$ and $TaN_x$ in the high-k/metal gate integration scheme has been challenging due to the similar physical and chemical properties of these metal nitrides.

Towards that end, an object of the invention is to provide improved compositions and methods for the selective removal of one metal gate material relative to a second metal gate material from a microelectronic device having same thereon, said compositions being compatible with other gate stack materials present on the substrate.

SUMMARY OF THE INVENTION

The present invention generally relates to compositions and methods for selectively removing one metal gate material relative to a second metal gate material from a substrate comprising same. The substrate preferably comprises a high-k/metal gate integration scheme.

In one aspect, a method of selectively removing a first metal gate material relative to at least a second metal gate material is described, said method comprising contacting a substrate comprising the first metal gate material and the second metal gate material with a removal composition, wherein the removal composition selectively removes the first metal gate material relative to the second metal gate material.

In another aspect, a method of selectively removing a first metal gate material relative to at least a second metal gate material is described, said method comprising contacting a substrate comprising the first metal gate material and the second metal gate material with a removal composition, wherein the removal composition selectively removes the first metal gate material relative to the second metal gate material, and wherein the removal composition comprises at least one oxidizing agent and at least one metal nitride inhibitor.

Other aspects, features and advantages of the invention will be more fully apparent from the ensuing disclosure and appended claims.

DETAILED DESCRIPTION, AND PREFERRED EMBODIMENTS THEREOF

The present invention generally relates to compositions and methods for selectively removing one metal gate material relative to a second metal gate material from a substrate comprising same. More specifically, the present invention generally relates to compositions and a wet-based method for selectively removing one metal gate material relative to a second metal gate material from a substrate comprising same, wherein the composition and method do not substantially remove other gate stack materials present on the substrate. The substrate preferably comprises a high-k/metal gate integration scheme.

For ease of reference, "microelectronic device" corresponds to semiconductor substrates, flat panel displays, phase change memory devices, solar panels and other products including solar cell devices, photovoltaic, and microelectromechanical systems (MEMS), manufactured for use in microelectronic, integrated circuit, energy collection, or computer chip applications. It is to be understood that the terms "microelectronic device," "microelectronic substrate" and "microelectronic device structure" are not meant to be limiting in any way and include any substrate or structure that will eventually become a microelectronic device or microelectronic assembly. The microelectronic device can be patterned, blanketed, a control and/or a test device.

As defined herein, "metal gate material" corresponds to materials having a Fermi level corresponding to the mid-gap of the semiconductor substrate such as Ti, Ta, W, Mo, Ru, Al, La, titanium nitride, tantalum nitride, tantalum carbide, titanium carbide, molybdenum nitride, tungsten nitride, ruthenium (IV) oxide, tantalum silicon nitride, titanium silicon nitride, tantalum carbon nitride, titanium carbon nitride, titanium aluminide, tantalum aluminide, titanium aluminum nitride, tantalum aluminum nitride, lanthanum oxide, or combinations thereof. It should be appreciated that the compounds disclosed as metal gate materials may have varying stoichiometries. Accordingly, titanium nitride will be represented as $TiN_x$ herein, tantalum nitride will be represented as $TaN_x$ herein, and so on.

As defined herein, "high-k dielectric" materials correspond to: hafnium oxides (e.g., $HfO_2$); zirconium oxides (e.g., $ZrO_2$); hafnium oxysilicates; hafnium silicates; zirconium silicates; titanium silicates; aluminum oxides; lanthanum-doped analogous thereof (e.g., $LaAlO_3$); aluminum silicates; titanates (e.g., $Ta_2O_5$); oxides and nitrides of hafnium and silicon (e.g., HfSiON); lanthanum-doped analogues thereof (e.g., HFSiON (La)); barium strontium titanate (BST); oxides of hafnium and aluminum (e.g., $Hf_xAl_yO_z$); strontium titanate ($SrTiO_3$); barium titanate ($BaTiO_3$); and combinations thereof.

As defined herein, "gate stack materials" correspond to: tantalum, tantalum nitride, titanium nitride, titanium, nickel, cobalt, tungsten, tungsten nitride, and silicides of the aforementioned metals; low-k dielectrics; polysilicon; poly-SiGe; silicon oxide; silicon nitride; BEOL layers; high-k replacement gates; hafnium oxides; hafnium oxysilicates; zirconium oxides; lanthanide oxides; titanates; nitrogen-doped analogues thereof; ruthenium; iridium; cadmium; lead; selenium; silver; MoTa; and combinations and salts thereof on the microelectronic device.

As used herein, "about" is intended to correspond to ±5% of the stated value.

"Substantially devoid" is defined herein as less than 2 wt. %, preferably less than 1 wt. %, more preferably less than 0.5 wt. %, even more preferably less than 0.1 wt. %, and most preferably 0 wt. %.

As used herein, "selectively removing a first metal gate material relative to a second metal gate material" corresponds to etch rate selectivity of about 2:1 to about 1000:1, preferably about 2:1 to about 100:1, and most preferably about 3:1 to about 50:1. In other words, when the etch rate of the first metal gate material is 2 Å min$^{-1}$ (or up to 1000 Å min$^{-1}$), the etch rate of the second metal gate material is 1 Å min$^{-1}$.

As used herein, the term "remove" corresponds to the selective removal of the first metal gate material from the substrate into the composition. It should be appreciated that the first metal gate material is dissolved or otherwise solubilized in the composition, preferably dissolved. Further, it should be appreciated by the skilled artisan that the composition may include a negligible amount of the second metal gate material from the substrate dissolved or otherwise solubilized therein.

As defined herein, "amine" species include at least one primary, secondary, tertiary amines and amine-N-oxides, with the proviso that (i) species including both a carboxylic acid group and an amine group, (ii) surfactants that include amine groups, and (iii) species where the amine group is a substituent (e.g., attached to an aryl or heterocyclic moiety) are not considered "amines" according to this definition. The amine formula can be represented by $NR^1R^2R^3$, wherein $R^1$, $R^2$ and $R^3$ can be the same as or different from one another and are selected from the group consisting of hydrogen, straight-chained or branched $C_1$-$C_6$ alkyls (e.g., methyl, ethyl, propyl, butyl, pentyl, hexyl), $C_6$-$C_{10}$ aryls (e.g., benzyl), straight-chained or branched $C_1$-$C_6$ alkanols (e.g., methanol, ethanol, propanol, butanol, pentanol, hexanol), and combinations thereof, with the proviso that $R^1$, $R^2$ and $R^3$ cannot all be hydrogen.

As used herein, "fluoride" species correspond to species including an ionic fluoride (F$^-$) or covalently bonded fluorine. It is to be appreciated that the fluoride species may be included as a fluoride species or generated in situ.

As used herein, "chloride" species correspond to species including an ionic chloride (Cl$^-$), with the proviso that surfactants that include chloride anions are not considered "chlorides" according to this definition.

Compositions of the invention may be embodied in a wide variety of specific formulations, as hereinafter more fully described.

In all such compositions, wherein specific components of the composition are discussed in reference to weight percentage ranges including a zero lower limit, it will be understood that such components may be present or absent in various specific embodiments of the composition, and that in instances where such components are present, they may be present at concentrations as low as 0.001 weight percent, based on the total weight of the composition in which such components are employed.

In one aspect, a method of selectively removing a first metal gate material relative to at least a second metal gate material is described, said method comprising contacting a substrate comprising the first metal gate material and the second metal gate material with a removal composition, wherein the removal composition selectively removes the first metal gate material relative to the second metal gate material. Preferably, the composition does not substantially remove other gate stack materials present on the substrate. In one embodiment, the first metal gate material comprises titanium and the second metal gate material comprises tantalum. In another embodiment, the first metal gate material is a first metal nitride and the second metal gate material is a second metal nitride. In yet another embodiment, the first metal gate material is titanium nitride and the second metal gate material is tantalum nitride. In another embodiment, the first metal gate material is tantalum nitride and the second metal gate material is titanium nitride. The substrate preferably comprises a high-k/metal gate integration scheme. It should be appreciated that the first metal gate material is not necessarily the firstly deposited metal gate material, e.g., when at least two metal gate materials are deposited on a substrate, but rather the metal gate material that is preferentially selectively removed.

The method selectively removes the first metal gate material relative to the second metal gate material at temperatures in a range from about room temperature to about 100° C., preferably about 40° C. to about 80° C. It should be appreciated by the skilled artisan that the time of removal varies depending on whether the removal is performed in a single wafer tool or a multiple wafer tool, wherein time preferentially is in a range from about 1 minute to about 10 minutes for the former and about 1 minute to about 60 minutes for the latter. Such contacting times and temperatures are illustrative, and any other suitable time and temperature conditions may be employed that are efficacious to selectively remove the first metal gate material relative to the second metal gate material from the substrate.

Preferably the removal rate of the first metal gate material is in a range from about 20 Å min$^{-1}$ to about 200 Å min$^{-1}$, more preferably about 30 Å min$^{-1}$ to about 100 Å min$^{-1}$. Preferably the removal of the first metal gate material is isotropic. The removal rate of the second metal gate material is lower than that of the first metal gate material, as described herein.

In a second aspect, a fluoride-containing removal composition is described, said fluoride-containing removal composition including at least one fluoride, at least one metal nitride inhibitor, optionally at least one oxidizing agent, optionally at least one surfactant, and at least one solvent, for selectively removing a first metal gate material relative to a second metal gate material. Preferably, the composition does not substantially remove other gate stack materials present on the substrate. In one embodiment, the removal compositions of the invention comprise, consist of, or consist essentially of at least one fluoride, at least one metal nitride inhibitor, and at least one solvent. In yet another embodiment, the removal compositions of the invention comprise, consist of, or consist essentially of at least one fluoride, at least one metal nitride inhibitor, at least one oxidizer, and at least one solvent. In still another embodiment, the removal compositions of the invention comprise, consist of, or consist essentially of at least one fluoride, at least one metal nitride inhibitor, at least one surfactant, and at least one solvent. In yet another embodiment, the removal compositions of the invention comprise, consist of, or consist essentially of at least one fluoride, at least one metal nitride inhibitor, at least one oxidizer, at least one surfactant, and at least one solvent.

In a preferred embodiment of the invention, the fluoride-containing removal composition is substantially devoid of abrasive or other inorganic particulate material, amines, chlorides (Cr), metal halides, silicates, and combinations thereof. The pH of the fluoride-containing removal composition of the second aspect is preferably in a range from about 3 to about 7.

The at least one solvent can comprise water and at least one water-miscible organic solvent selected from the group consisting of a compound of formula $R^1R^2R^3C(OH)$, where $R^1$, $R^2$ and $R^3$ are independent from each other and are selected from to the group consisting of hydrogen, $C_2$-$C_{30}$alkyls, $C_2$-$C_{30}$alkenes, cycloalkyls, $C_2$-$C_{30}$alkoxys, and combinations thereof. For example, the at least one solvent can comprise at least one species selected from the group consisting of water, methanol, ethanol, isopropanol, butanol, pentanol, hexanol, 2-ethyl-1-hexanol, heptanol, octanol, ethylene glycol, propylene glycol, butylene glycol, butylene carbonate, ethylene carbonate, propylene carbonate, dipropylene glycol, diethylene glycol monomethyl ether, triethylene glycol monomethyl ether, diethylene glycol monoethyl ether, triethylene glycol monoethyl ether, ethylene glycol monopropyl ether, ethylene glycol monobutyl ether, diethylene glycol monobutyl ether, triethylene glycol monobutyl ether, ethylene glycol monohexyl ether, diethylene glycol monohexyl ether, ethylene glycol phenyl ether, propylene glycol methyl ether, dipropylene glycol methyl ether (DPGME), tripropylene glycol methyl ether (TPGME), dipropylene glycol dimethyl ether, dipropylene glycol ethyl ether, propylene glycol n-propyl ether, dipropylene glycol n-propyl ether (DPGPE), tripropylene glycol n-propyl ether, propylene glycol n-butyl ether, dipropylene glycol n-butyl ether, tripropylene glycol n-butyl ether, propylene glycol phenyl ether, 2,3-dihydrodecafluoropentane, ethyl perfluorobutylether, methyl perfluorobutylether, alkyl carbonates, alkylene carbonates, 4-methyl-2-pentanol, dense fluid, and combinations thereof. Preferably, the at least one solvent comprises water, most preferably deionized water.

The at least one fluoride source includes, but is not limited to, hydrofluoric acid, ammonium fluoride, ammonium bifluoride, hexafluorosilicic acid, tetrafluoroboric acid, tetrabutylammonium tetrafluoroborate (TBA-BF$_4$), hexafluorotantalic acid, ammonium hexafluorotantalate, and combinations thereof. Preferably, the fluoride source comprises ammonium bifluoride, TBA-BF$_4$, or a combination thereof.

Oxidizing agents contemplated herein include, but are not limited to, ozone, hydrogen peroxide ($H_2O_2$), oxone, oxone tetrabutylammonium salt, ferric nitrate (Fe(NO$_3$)$_3$), potassium iodate (KIO$_3$), iodic acid (HIO$_3$), periodic acid ($H_5IO_6$), potassium permanganate (KMnO$_4$), permanganic acid (HMnO$_4$), chromium (III) oxide, ammonium cerium nitrate ((NH$_4$)$_2$Ce(NO$_3$)$_6$), nitric acid (HNO$_3$), ammonium chlorite (NH$_4$ClO$_2$), ammonium chlorate (NH$_4$ClO$_3$), ammonium iodate (NH$_4$IO$_3$), ammonium perborate (NH$_4$BO$_3$), ammonium perchlorate (NH$_4$ClO$_4$), ammonium periodate (NH$_4$IO$_3$), ammonium persulfate ((NH$_4$)$_2$S$_2$O$_8$), sodium persulfate (Na$_2$S$_2$O$_8$), potassium persulfate (K$_2$S$_2$O$_8$), tetramethylammonium chlorite ((N(CH$_3$)$_4$)ClO$_2$), tetramethylammonium chlorate ((N(CH$_3$)$_4$)ClO$_3$), tetramethylammonium iodate ((N(CH$_3$)$_4$)IO$_3$), tetramethylammonium perborate ((N(CH$_3$)$_4$)BO$_3$), tetramethylammonium perchlorate ((N(CH$_3$)$_4$)ClO$_4$), tetramethylammonium periodate ((N(CH$_3$)$_4$)IO$_4$), tetramethylammonium persulfate ((N(CH$_3$)$_4$)S$_2$O$_8$), urea hydrogen peroxide ((CO(NH$_2$)$_2$)H$_2$O$_2$), peracetic acid (CH$_3$(CO)OOH), and combinations thereof. Preferably, the oxidizing agent includes hydrogen peroxide. The oxidizing agent may be introduced to the composition at or prior to the fab. When oxidizing agent is present, the removal composition may be further supplemented with at least one acid including, but not limited to, sulfuric acid, nitric acid, acetic acid, trifluoroacetic acid, and hydrochloric acid.

Metal nitride inhibitors preferably inhibit the removal of the second metal gate material relative to the first metal gate material and include, but are not limited to, boric acid, ammonium borates, ascorbic acid, L(+)-ascorbic acid, isoascorbic acid, ascorbic acid derivatives, gallic acid, diphosphonic acids such as 1-hydroxyethylidene-1,1-diphosphonic acid (HEDP), 1-hydroxyethane-1,1-diphosphonic acid, nitrilotris(methylenephosphonic acid) (NTMPA), N,N,N',N'-ethylenediaminetetra(methylenephosphonic)acid (EDTMP), 1,5,9-triazacyclododecane-N,N',N"-tris(methylenephosphonic acid) (DOTRP), 1,4,7,10-tetraazacyclododecane-N,N',N",N'''-tetrakis(methylenephosphonic acid) (DOTP), diethylenetriaminepenta(methylenephosphonic acid) (DETAP), aminotri(methylenephosphonic acid), bis(hexamethylene)triamine phosphonic acid, 1,4,7-triazacyclononane-N,N',N"-tris(methylenephosphonic acid) (NOTP), esters of phosphoric acids; 5-amino-1,3,4-thiadiazole-2-thiol (ATDT), benzotriazole (BTA), citric acid, oxalic acid, tannic acid, ethylenediaminetetraacetic acid (EDTA), uric acid, 1,2,4-triazole (TAZ), tolyltriazole, 5-phenyl-benzotriazole, 5-nitro-benzotriazole, 3-amino-5-mercapto-1,2,4-triazole, 1-amino-1,2,4-triazole, hydroxybenzotriazole, 2-(5-aminopentyl)-benzotriazole, 1-amino-1,2,3-triazole, 1-amino-5-methyl-1,2,3-triazole, 3-amino-1,2,4-triazole, 3-mercapto-1,2,4-triazole, 3-isopropyl-1,2,4-triazole, 5-phenylthiol-benzotriazole, halo-benzotriazoles (halo=F, Cl, Br or I), naphthotriazole, 2-mercaptobenzimidazole (MBI), 2-mercaptobenzothiazole, 4-methyl-2-phenylimidazole, 2-mercaptothiazoline, 5-aminotetrazole, 2,4-diamino-6-methyl-1,3,5-triazine, thiazole, triazine, methyltetrazole, 1,3-dimethyl-2-imidazolidinone, 1,5-pentamethylenetetrazole, 1-phenyl-5-mercaptotetrazole, diaminomethyltriazine, imidazoline thione, mercaptobenzimidazole, 4-methyl-4H-1,2,4-triazole-3-thiol, benzothiazole, tritolyl phosphate, imidazole, indiazole, benzoic acid, malonic acid, ammonium benzoate, catechol, pyrogallol, resorcinol, hydroquinone, cyanuric acid, barbituric acid and derivatives such as 1,2-dimethylbarbituric acid, alpha-keto acids such as pyruvic acid, adenine, purine, glycine/ascorbic acid, Dequest 2000, Dequest 7000, p-tolylthiourea, succinic acid, phosphonobutane tricarboxylic acid (PBTCA), and combinations thereof. Other disphosphonic acids contemplated include derivatives of formula I, wherein $R^1$, $R^2$, $R^3$, $R^4$, $R^5$, $R^6$, $R^7$ are independently selected, but not limited to, hydrogen, alkyl groups, cyclic alkyl groups, alkoxy groups, and n is integer from 0 to 20.

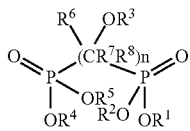

Formula I

In another embodiment, the metal nitride inhibitor comprises a compound having the formula $(R^1)(R^2)P(=O)(R^3)$, wherein $R^1$, $R^2$ and $R^3$ are independent from one another and are selected from the group consisting of hydrogen, hydroxyl, $C_1$-$C_{30}$ alkyls, $C_2$-$C_{30}$ alkenes, cycloalkyls, $C_2$-$C_{30}$ alkoxys, or any combination thereof. In yet another embodiment, the metal nitride inhibitor comprises a compound having the formula $(R^1R^2R^3R^4)NX$, wherein $R^1$, $R^2$, $R^3$, and $R^4$, are independent from one another and are selected from the group consisting of hydrogen, $C_1$-$C_{30}$ alkyls, $C_2$-$C_{30}$ alkenes, cycloalkyls, $C_1$-$C_{30}$ alkoxys, $C_1$-$C_{30}$ carboxylates, or any combination thereof, and wherein X is any anion having a −1 charge. In still another embodiment, the metal nitride inhibitor comprises a compound having the formula $[(R^1)(R^2)N]C(=O)(CR^3R^4)_nC(=O)[N(R^5)(R^6)]$, wherein $R^1$, $R^2$, $R^3$, $R^4$, $R^5$, and $R^6$ are independent from one another and are selected from the group consisting of hydrogen, $C_2$-$C_{30}$ alkyls, $C_2$-$C_{30}$ alkenes, cycloalkyls, $C_2$-$C_{30}$ alkoxys, $C_2$-$C_{30}$ carboxylates, or any combination thereof, and wherein n=any integer from 1-12. In another embodiment, the metal nitride inhibitor comprises carboxylic acids with the formula $R^1C(=O)(OH)$ or $R^1C(=O)(OH)(CH_2)_n(O=)(HO)CR^2$, wherein $R^1$ or $R^2$ are selected from $C_1$-$C_{30}$ alkyl or $C_2$-$C_{30}$ alkylene chains, preferably $C_1$-$C_{20}$ alkyl or $C_2$-$C_{20}$ alkylene chains, n are integers between 0 and 20. Preferred inhibitors include at least one of decylphosphonic acid, dodecylphosphonic acid (DDPA), tetradecylphosphonic acid, hexadecylphosphonic acid, bis(2-ethylhexyl)phosphate, octadecylphosphonic acid, perfluoroheptanoic acid, prefluorodecanoic acid, trifluoromethanesulfonic acid, phosphonoacetic acid, dodecylbenzenesulfonic acid, dodecenylsuccinic acid, dioctadecyl hydrogen phosphate, octadecyl dihydrogen phosphate, dodecylamine, dodecenylsuccinic acid monodietha-nol amide, lauric acid, palmitic acid, oleic acid, juniperic acid, hydroxystearic acid, octadecylphosphonic acid (ODPA), and combinations thereof. Most preferably, the metal nitride inhibitor comprises HEDP, dodecylphosphonic acid, octadecylphosphonic acid, or any combination thereof.

It should be appreciated that the metal nitride inhibitor preferably inhibits the removal of the second metal gate material relative to the first metal gate material. Even more preferably the metal nitride inhibitor simultaneously accelerates the removal of the first metal gate material. There may be situations where the metal nitride inhibitor suppresses the removal of both the first and second metal gate material, in which case the metal nitride inhibitor may still be acceptable assuming that the second metal gate material is substantially inhibited and/or an accelerator for the removal of the first metal gate material is included.

Surfactants contemplated include, but are not limited to, acids and bases, non-ionic surfactants, anionic surfactants, cationic surfactants, zwitterionic surfactants, and combinations thereof. Preferred acidic or basic surfactants include, but are not limited to, surfactants having an acid or base functionality ("head") and a straight-chained or branched hydrocarbon group ("tail") and/or surfactants having an acid functionality ("head") and a perfluorinated hydrocarbon group ("tail"). Preferred acid or base functionalities include phosphoric, phosphonic, phosphonic monoesters, phosphate monoesters and diesters, carboxylic acids, dicarboxylic acid monoesters, tricarboxylic acid mono- and diesters, sulfate monoesters, sulfonic acids, amines, and salts thereof. The hydrocarbon groups preferably have at least 10, e.g., 10-24, carbon atoms (e.g., decyl, undecyl, dodecyl, tridecyl, tetradecyl, pentadecyl, hexadecyl, heptadecyl, octadecyl, nonadecyl, eicosyl), except that somewhat shorter hydrocarbon groups of 6-20 carbons (e.g. hexyl, 2-ethylhexyl, dodecyl) are preferred where the molecule contains two alkyl chains such as in phosphate diesters and phosphonate monoesters. The perfluorinated hydrocarbon groups preferably have 7-14 carbon atoms (e.g., heptyl, octyl, nonyl, decyl, undecyl, dodecyl, tridecyl, tetradecyl). Preferred surfactants include decylphosphonic acid, dodecylphosphonic acid, tetradecylphosphonic acid, hexadecylphosphonic acid, bis(2-ethylhexyl)phosphate, octadecylphosphonic acid, perfluoroheptanoic acid, prefluorodecanoic acid, trifluoromethanesulfonic acid, phosphonoacetic acid, dodecylbenzenesulfonic acid, and dodecylamine.

Non-ionic surfactants contemplated include, but are not limited to, polyoxyethylene lauryl ether (Emalmin NL-100 (Sanyo), Brij 30, Brij 98), dodecenylsuccinic acid monodiethanol amide (DSDA, Sanyo), ethylenediamine tetrakis (ethoxylate-block-propoxylate) tetrol (Tetronic 90R4), polyoxyethylene polyoxypropylene glycol (Newpole PE-68 (Sanyo), Pluronic L31, Pluronic 31R1), polyoxypropylene sucrose ether (SN008S, Sanyo), t-octylphenoxypolyethoxyethanol (Triton X100), Polyoxyethylene (9) nonylphenylether, branched (IGEPAL CO-250), polyoxyethylene sorbitol hexaoleate, polyoxyethylene sorbitol tetraoleate, polyethylene glycol sorbitan monooleate (Tween 80), sorbitan monooleate (Span 80), alkyl-polyglucoside, ethyl perfluorobutyrate, 1,1,3,3,5,5-hexamethyl-1,5-bis[2-(5-norbornen-2-yl)ethyl]trisiloxane, monomeric octadecylsilane derivatives such as SIS6952.0 (Siliclad, Gelest), siloxane modified polysilazane such as PP1-SG10 Siliclad Glide 10 (Gelest), silicone-polyether copolymers such as Silwet L-77 (Setre Chemical Company), Silwet ECO Spreader (Momentive), and alcohol ethoxylates (Natsurf™ 265, Croda).

Cationic surfactants contemplated include, but are not limited to, heptadecanefluorooctane sulfonic acid tetraethylammonium, stearyl trimethylammonium chloride (Econol TMS-28, Sanyo), 4-(4-diethylaminophenylazo)-1-(4-nitrobenzyl)pyridium bromide, cetylpyridinium chloride monohydrate, benzalkonium chloride, benzethonium chloride benzyldimethyldodecylammonium chloride, benzyldimethylhexadecylammonium chloride, hexadecyltrimethylammonium bromide, dimethyldioctadecylammonium chloride, dodecyltrimethylammonium chloride, hexadecyltrimethylammonium p-toluenesulfonate, didodecyldimethylammonium bromide, di(hydrogenated tallow)dimethylammonium chloride, tetraheptylammonium bromide, tetrakis (decyl)ammonium bromide, Aliquat® 336 and oxyphenonium bromide. The hydrocarbon groups preferably have at least 10, e.g., 10-24, carbon atoms (e.g., decyl, undecyl, dodecyl, tridecyl, tetradecyl, pentadecyl, hexadecyl, heptadecyl, octadecyl, nonadecyl, eicosyl), except that somewhat shorter hydrocarbon groups of 6-20 carbons (e.g. hexyl, 2-ethylhexyl, dodecyl) are preferred where the molecule contains two functionized alkyl chains such as in dimethyldioctadecylammonium chloride, dimethyldihexadecylammonium bromide and di(hydrogenated tallow)dimethylammonium chloride.

Anionic surfactants contemplated include, but are not limited to, sodium polyoxyethylene lauryl ether, sodium dihexylsulfosuccinate, dicyclohexyl sulfosuccinate sodium salt, sodium 7-ethyl-2-methyl-4-undecyl sulfate (Tergitol 4), SODOSIL RMO2, and phosphate fluorosurfactants such as Zonyl FSJ.

Zwitterionic surfactants include, but are not limited to, ethylene oxide alkylamines (AOA-8, Sanyo), N,N-dimethyldodecylamine N-oxie, sodium cocaminpropinate (LebonApl-D, Sanyo), 3-(N,N-dimethylmyristylammonio)propanesulfonate, and (3-(4-heptyl)phenyl-3-hydroxypropyl) dimethylammoniopropanesulfonate.

In a preferred embodiment, the removal composition of the second aspect comprises, consists of, or consists essentially of:

|  | preferably | more preferably |
| --- | --- | --- |
| fluoride(s) | about 0.01 wt % to about 10 wt % | about 0.01 wt % to about 2 wt % |
| metal nitride inhibitor(s) | about 0.01 wt % to about 20 wt % | about 0.01 wt % to about 10 wt % |
| oxidizing agent(s) | 0 to about 30 wt % | 0.01 wt % to about 10 wt % |
| surfactant(s) | 0 to about 10 wt % | about 0.01 wt % to about 5 wt % |
| solvent(s) | about 55 wt % to about 99 wt % | about 84 wt % to about 99.5 wt % |

In a third aspect, a second removal composition substantially devoid of fluoride is described, said removal composition including at least one oxidizing agent, at least one metal nitride inhibitor, at least one etchant compound, optionally at least one surfactant, and at least one solvent, for selectively removing a first metal gate material relative to a second metal gate material, wherein the second removal composition is substantially devoid of fluoride. Preferably, the second removal composition does not substantially remove other gate stack materials present on the substrate. In one embodiment, the second removal compositions of the invention comprise, consist of, or consist essentially of at least one oxidizing agent, at least one metal nitride inhibitor, at least one etchant compound, and at least one solvent, wherein the second removal composition is substantially devoid of fluoride. In yet another embodiment, the removal compositions of the invention comprise, consist of, or consist essentially of at least one oxidizing agent, at least one metal nitride inhibitor, at least one etchant compound, at least one surfactant, and at least one solvent, wherein the second removal composition is substantially devoid of fluoride.

The at least one solvent can comprise water and at least one water-miscible organic solvent selected from the group consisting of a compound of formula $R^1R^2R^3C(OH)$, where $R^1$, $R^2$ and $R^3$ are independent from each other and are selected from to the group consisting of hydrogen, $C_2$-$C_{30}$alkyls, $C_2$-$C_{30}$alkenes, cycloalkyls, $C_2$-$C_{30}$alkoxys, and combinations thereof. For example, the at least one solvent can comprise at least one species selected from the group consisting of water, methanol, ethanol, isopropanol, butanol, pentanol, hexanol, 2-ethyl-1-hexanol, heptanol, octanol, ethylene glycol, propylene glycol, butylene glycol, butylene carbonate, ethylene carbonate, propylene carbonate, dipropylene glycol, diethylene glycol monomethyl ether, triethylene glycol monomethyl ether, diethylene glycol monoethyl ether, triethylene glycol monoethyl ether, ethylene glycol monopropyl ether, ethylene glycol monobutyl ether, diethylene glycol monobutyl ether, triethylene glycol monobutyl ether, ethylene glycol monohexyl ether, diethylene glycol monohexyl ether, ethylene glycol phenyl ether, propylene glycol methyl ether, dipropylene glycol methyl ether (DPGME), tripropylene glycol methyl ether (TPGME), dipropylene glycol dimethyl ether, dipropylene glycol ethyl ether, propylene glycol n-propyl ether, dipropylene glycol n-propyl ether (DPGPE), tripropylene glycol n-propyl ether, propylene glycol n-butyl ether, dipropylene glycol n-butyl ether, tripropylene glycol n-butyl ether, propylene glycol phenyl ether, 2,3-dihydrodecafluoropentane, ethyl perfluorobutylether, methyl perfluorobutylether, alkyl carbonates, alkylene carbonates, 4-methyl-2-pentanol, dense fluid, and combinations thereof. Preferably, the at least one solvent comprises water, most preferably deionized water.

Oxidizing agents contemplated herein include, but are not limited to, ozone, hydrogen peroxide ($H_2O_2$), oxone, oxone tetrabutylammonium salt, ferric nitrate ($Fe(NO_3)_3$), potassium iodate ($KIO_3$), iodic acid ($HIO_3$), periodic acid ($H_5IO_6$), potassium permanganate ($KMnO_4$), permanganic acid ($HMnO_4$), chromium (III) oxide, ammonium cerium nitrate (($NH_4)_2Ce(NO_3)_6$), nitric acid ($HNO_3$), ammonium chlorite ($NH_4ClO_2$), ammonium chlorate ($NH_4ClO_3$), ammonium iodate ($NH_4IO_3$), ammonium perborate ($NH_4BO_3$), ammonium perchlorate ($NH_4ClO_4$), ammonium periodate ($NH_4IO_3$), ammonium persulfate (($NH_4)_2S_2O_8$), sodium persulfate ($Na_2S_2O_8$), potassium persulfate ($K_2S_2O_8$), tetramethylammonium chlorite (($N(CH_3)_4)ClO_2$), tetramethylammonium chlorate (($N(CH_3)_4)ClO_3$), tetramethylammonium iodate (($N(CH_3)_4)IO_3$), tetramethylammonium perborate (($N(CH_3)_4)BO_3$), tetramethylammonium perchlorate (($N(CH_3)_4)ClO_4$), tetramethylammonium periodate (($N(CH_3)_4)IO_4$), tetramethylammonium persulfate (($N(CH_3)_4)S_2O_8$), urea hydrogen peroxide (($CO(NH_2)_2$) $H_2O_2$), peracetic acid ($CH_3(CO)OOH$), and combinations thereof. Preferably, the oxidizing agent includes hydrogen peroxide. The oxidizing agent may be introduced to the composition at or prior to the fab. When oxidizing agent is present, the removal composition may be further supplemented with at least one acid including, but not limited to, sulfuric acid, nitric acid, acetic acid, trifluoroacetic acid, and hydrochloric acid.

Metal nitride inhibitors preferably inhibit the removal of the second metal gate material relative to the first metal gate material and include, but are not limited to, boric acid, ammonium borates, ascorbic acid, L(+)-ascorbic acid, isoascorbic acid, ascorbic acid derivatives, gallic acid, diphosphonic acids such as 1-hydroxyethylidene-1,1-diphosphonic acid (HEDP), 1-hydroxyethane-1,1-diphosphonic acid, nitrilotris(methylenephosphonic acid) (NT-MPA), N,N,N',N'-ethylenediaminetetra (methylenephosphonic)acid (EDTMP), 1,5,9-triazacyclododecane-N,N',N''-tris(methylenephosphonic acid) (DOTRP), 1,4,7,10-tetraazacyclododecane-N,N',N'',N'''-tetrakis(methylenephosphonic acid) (DOTP), diethylenetriaminepenta(methylenephosphonic acid) (DETAP), aminotri(methylenephosphonic acid), bis(hexamethylene) triamine phosphonic acid, 1,4,7-triazacyclononane-N,N',N''-tris(methylenephosphonic acid (NOTP), esters of phosphoric acids; 5-amino-1,3,4-thiadiazole-2-thiol (ATDT), benzotriazole (BTA), citric acid, oxalic acid, tannic acid, ethylenediaminetetraacetic acid (EDTA), uric acid, 1,2,4-triazole (TAZ), tolyltriazole, 5-phenyl-benzotriazole, 5-nitro-benzotriazole, 3-amino-5-mercapto-1,2,4-triazole, 1-amino-1,2,4-triazole, hydroxybenzotriazole, 2-(5-aminopentyl)-benzotriazole, 1-amino-1,2,3-triazole, 1-amino-5-methyl-1,2,3-triazole, 3-amino-1,2,4-triazole, 3-mercapto-1,2,4-triazole, 3-isopropyl-1,2,4-triazole, 5-phenylthiol-benzotriazole, halo-benzotriazoles (halo=F, Cl, Br or I), naphthotriazole, 2-mercaptobenzimidazole (MBI), 2-mercaptobenzothiazole, 4-methyl-2-phenylimidazole, 2-mercaptothiazoline, 5-aminotetrazole, 2,4-diamino-6-methyl-1,3,5-triazine, thiazole, triazine, methyltetrazole, 1,3-dimethyl-2-imidazolidinone, 1,5-pentamethylenetetrazole, 1-phenyl-5-mercaptotetrazole, diaminomethyltriazine, imidazoline thione, mercaptobenzimidazole, 4-methyl-4H-1,2,4-triazole-3-thiol, benzothiazole, tritolyl phosphate, imidazole, indiazole, benzoic acid, malonic acid, ammonium benzoate, catechol, pyrogallol, resorcinol, hydroquinone, cyanuric acid, barbituric acid and derivatives such as 1,2-dimethylbarbituric acid, alpha-keto acids such as pyruvic acid, adenine, purine, glycine/ascorbic acid, Dequest 2000, Dequest 7000, p-tolylthiourea, succinic acid, phosphonobutane tricarboxylic acid (PBTCA), and combinations thereof. Other disphosphonic acids contemplated include derivatives of formula I, wherein $R^1$, $R^2$, $R^3$, $R^4$, $R^5$, $R^6$, $R^7$ are independently selected, but not limited to, hydrogen, alkyl groups, cyclic alkyl groups, alkoxy groups, and n is integer from 0 to 20.

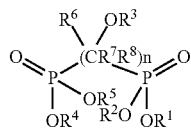

Formula I

In another embodiment, the metal nitride inhibitor comprises a compound having the formula $(R^1)(R^2)P(=O)(R^3)$, wherein $R^1$, $R^2$ and $R^3$ are independent from one another and are selected from the group consisting of hydrogen, hydroxyl, $C_1$-$C_{30}$ alkyls, $C_2$-$C_{30}$ alkenes, cycloalkyls, $C_2$-$C_{30}$ alkoxys, or any combination thereof. In yet another embodiment, the metal nitride inhibitor comprises a compound having the formula $(R^1R^2R^3R^4)NX$, wherein $R^1$, $R^2$, $R^3$, and $R^4$, are independent from one another and are selected from the group consisting of hydrogen, $C_1$-$C_{30}$ alkyls, $C_2$-$C_{30}$ alkenes, cycloalkyls, $C_1$-$C_{30}$ alkoxys, $C_1$-$C_{30}$ carboxylates, or any combination thereof, and wherein X is any anion having a −1 charge. In still another embodiment, the metal nitride inhibitor comprises a compound having the formula $[(R^1)(R^2)N]C(=O)(CR^3R^4)_nC(=O)[N(R^5)(R^6)]$, wherein $R^1$, $R^2$, $R^3$, $R^4$, $R^5$, and $R^6$ are independent from one another and are selected from the group consisting of hydrogen, $C_2$-$C_{30}$ alkyls, $C_2$-$C_{30}$ alkenes, cycloalkyls, $C_2$-$C_{30}$ alkoxys, $C_2$-$C_{30}$ carboxylates, or any combination thereof, and wherein n=any integer from 1-12. In another embodiment, the metal nitride inhibitor comprises carboxylic acids with the formula $R^1C(=O)(OH)$ or $R^1C(=O)(OH)(CH_2)_n(O=)(HO)CR^2$, wherein $R^1$ or $R^2$ are selected from $C_1$-$C_{30}$ alkyl or $C_2$-$C_{30}$ alkylene chains, preferably $C_1$-$C_{20}$ alkyl or $C_2$-$C_{20}$ alkylene chains, n are integers between 0 and 20. Preferred inhibitors include at least one of decylphosphonic acid, dodecylphosphonic acid (DDPA), tetradecylphosphonic acid, hexadecylphosphonic acid, bis (2-ethylhexyl)phosphate, octadecylphosphonic acid, perfluoroheptanoic acid, prefluorodecanoic acid, trifluoromethanesulfonic acid, phosphonoacetic acid, dodecylbenzenesulfonic acid, dodecenylsuccinic acid, dioctadecyl hydrogen phosphate, octadecyl dihydrogen phosphate, dodecylamine, dodecenylsuccinic acid monodiethanol amide, lauric acid, palmitic acid, oleic acid, juniperic acid, hydroxystearic acid, octadecylphosphonic acid (ODPA), and combinations thereof. Most preferably, the metal nitride inhibitor comprises HEDP, dodecylphosphonic acid, octadecylphosphonic acid, or any combination thereof.

The etchant compound can include, but are not limited to: ammonium or tetraalkylammonium salts of hydroxide, chloride, nitrate, bromide, iodide, nitrite, sulfate, sulfite, acetate, and phosphate, wherein the tetraalkylammonium cation has the formula $[NR^1R^2R^3R^4]^+$, wherein $R^1$, $R^2$, $R^3$ and $R^4$ are the same as or different from one another and are selected from the group consisting of $C_1$-$C_6$ alkyls (e.g., methyl, ethyl, propyl, butyl, pentyl, hexyl) and $C_6$-$C_{10}$ aryls (e.g., benzyl); potassium hydroxide; sodium hydroxide; lithium hydroxide; calcium hydroxide; magnesium hydroxide; and combinations thereof. Preferably, the etchant compound comprises ammonium hydroxide.

Surfactants contemplated for the second removal composition include those disclosed herein for the removal composition of the second aspect.

In a preferred embodiment of the invention, the second removal composition of the third aspect is substantially devoid of abrasive or other inorganic particulate material, fluoride, amines, chlorides, metal halides, silicates, and combinations thereof. The pH of the second removal composition of the third aspect is preferably in a range from about 7 to about 11.

In a preferred aspect, the second removal compositions of the third aspect comprises, consists of, or consists essentially of:

|  | preferably | more preferably |
| --- | --- | --- |
| oxidizing agent(s) | about 0.01 wt % to about 10 wt % | about 0.5 wt % to about 3 wt % |
| metal nitride inhibitor(s) | about 0.01 wt % to about 20 wt % | about 0.1 wt % to about 8 wt % |
| etchant(s) | about 0.01 wt % to about 20 wt % | about 1 wt % to about 10 wt % |
| surfactant(s) | 0 to about 5 wt % | about 0.01 wt % to about 5 wt % |
| solvent(s) | about 40 wt % to about 99 wt % | about 66 wt % to about 99 wt % |

In one embodiment, the second removal composition of the third aspect comprises, consists of, or consists essentially of ammonium hydroxide, hydrogen peroxide, boric acid and water. In another embodiment, the second removal composition of the third aspect comprises, consists of, or consists essentially of ammonium hydroxide, hydrogen peroxide, HEDP and water.

In another aspect of the present invention, any of the removal compositions described herein may further include dissolved first metal gate material, e.g., comprises material such as TiN. For example, the fluoride-containing removal compositions may comprise, consist essentially of, or consist of at least one fluoride, at least one metal nitride inhibitor, optionally at least one oxidizing agent, optionally at least one surfactant, first metal gate material and at least one solvent. In another embodiment, the second removal composition that is substantially devoid of fluoride comprises, consists of, or consists essentially of at least one oxidizing agent, at least one metal nitride inhibitor, at least one etchant compound, first metal gate material, optionally at least one surfactant, and at least one solvent, wherein the second removal composition is substantially devoid of fluoride.

It will be appreciated that it is common practice to make concentrated forms of the removal compositions to be diluted prior to use. For example, the removal composition may be manufactured in a more concentrated form, including at least one fluoride, at least one metal nitride inhibitor, optionally at least one oxidizing agent, optionally at least one surfactant, and thereafter diluted with solvent and/or the optional at least one oxidizing agent at the manufacturer, before use, and/or during use at the fab. In another embodiment, the removal composition may include at least one oxidizing agent, at least one metal nitride inhibitor, at least one etchant compound, optionally at least one surfactant, and thereafter diluted with solvent and/or the at least one oxidizing agent at the manufacturer, before use, and/or during use at the fab. In another embodiment, the removal composition may include at least one metal nitride inhibitor, at least one etchant compound, optionally at least one surfactant, and thereafter diluted with solvent and the at least one oxidizing agent at the manufacturer, before use, and/or during use at the fab. Dilution ratios may be in a range from about 0.1 part diluent:1 part removal composition concentrate to about 100 parts diluent:1 part removal composition concentrate.

The removal compositions of the invention are easily formulated by simple addition of the respective ingredients and mixing to homogeneous condition. Furthermore, the removal compositions may be readily formulated as single-package formulations or multi-part formulations that are mixed at or before the point of use, preferably multi-part formulations. The individual parts of the multi-part formulation may be mixed at the tool or in a mixing region/area such as an inline mixer or in a storage tank upstream of the tool. It is contemplated that the various parts of the multi-part formulation may contain any combination of ingredients/constituents that when mixed together form the desired removal composition. The concentrations of the respective ingredients may be widely varied in specific multiples of the removal composition, i.e., more dilute or more concentrated, in the broad practice of the invention, and it will be appreciated that the removal compositions of the invention can variously and alternatively comprise, consist or consist essentially of any combination of ingredients consistent with the disclosure herein.

Accordingly, another aspect of the invention relates to a kit including, in one or more containers, one or more components adapted to form the compositions of the invention. Preferably, the kit includes, in one or more containers, at least one fluoride, at least one metal nitride inhibitor, optionally at least one oxidizing agent, optionally at least one surfactant, for combining with solvent and/or oxidizing agent(s) at the fab or the point of use. Optionally, the containers of the kit may include at least one oxidizing agent, at least one metal nitride inhibitor, at least one etchant compound, optionally at least one surfactant, for combining with solvent and/or oxidizing agent(s) at the fab or the point of use. In another embodiment, the containers of the kit may include at least one metal nitride inhibitor, at least one etchant compound, optionally at least one surfactant, for combining with solvent and oxidizing agent(s) at the fab or the point of use. The containers of the kit must be suitable for storing and shipping said removal compositions, for example, NOWPak® containers (Advanced Technology Materials, Inc., Danbury, Conn., USA). The one or more containers which contain the components of the removal composition preferably include means for bringing the components in said one or more containers in fluid communication for blending and dispense. For example, referring to the NOWPak® containers, gas pressure may be applied to the outside of a liner in said one or more containers to cause at least a portion of the contents of the liner to be discharged and hence enable fluid communication for blending and dispense. Alternatively, gas pressure may be applied to the head space of a conventional pressurizable container or a pump may be used to enable fluid communication. In addition, the system preferably includes a dispensing port for dispensing the blended removal composition to a process tool.

Substantially chemically inert, impurity-free, flexible and resilient polymeric film materials, such as high density polyethylene, are preferably used to fabricate the liners for said one or more containers. Desirable liner materials are processed without requiring co-extrusion or barrier layers, and without any pigments, UV inhibitors, or processing agents that may adversely affect the purity requirements for components to be disposed in the liner. A listing of desirable liner materials include films comprising virgin (additive-free) polyethylene, virgin polytetrafluoroethylene (PTFE), polypropylene, polyurethane, polyvinylidene chloride, polyvinylchloride, polyacetal, polystyrene, polyacrylonitrile, polybutylene, and so on. Preferred thicknesses of such liner materials are in a range from about 5 mils (0.005 inch) to about 30 mils (0.030 inch), as for example a thickness of 20 mils (0.020 inch).

Regarding the containers for the kits, the disclosures of the following patents and patent applications are hereby incorporated herein by reference in their respective entireties: U.S. Pat. No. 7,188,644 entitled "APPARATUS AND METHOD FOR MINIMIZING THE GENERATION OF PARTICLES IN ULTRAPURE LIQUIDS;" U.S. Pat. No. 6,698,619 entitled "RETURNABLE AND REUSABLE, BAG-IN-DRUM FLUID STORAGE AND DISPENSING CONTAINER SYSTEM;" and U.S. patent application Ser. No. 60/916,966 entitled "SYSTEMS AND METHODS FOR MATERIAL BLENDING AND DISTRIBUTION" filed on May 9, 2007 in the name of John E. Q. Hughes, and PCT/US08/63276 entitled "SYSTEMS AND METHODS FOR MATERIAL BLENDING AND DISTRIBUTION" filed on May 9, 2008.

As applied to microelectronic manufacturing operations, the removal compositions of described herein are usefully employed to selectively remove a first metal gate material relative to a second metal gate material from the surface of the microelectronic device, and may be applied to said surface before or after the application of other compositions formulated to remove alternative materials from the surface of the device. Importantly, the removal compositions described herein selectively remove a first metal gate material relative to a second metal gate material while not substantially removing other metal stack materials present on the substrate.

In removal application, the removal composition is applied in any suitable manner to the device, e.g., by spraying the removal composition on the surface of the device, by dipping the device in a static or dynamic volume of the removal composition, by contacting the device with another material, e.g., a pad, or fibrous sorbent applicator element, that has the removal composition absorbed thereon, or by any other suitable means, manner or technique by which the removal composition is brought into removal contact with the device having the first and second metal gate materials. Further, batch or single wafer processing is contemplated herein.

Following the achievement of the desired removal action, the removal composition is readily removed from the device to which it has previously been applied, e.g., by rinse, wash, or other removal step(s), as may be desired and efficacious. For example, the device may be rinsed with a rinse solution including deionized water and/or dried (e.g., spin-dry, $N_2$, solvents (such as IPA) vapor-dry etc.).

Another aspect of the invention relates to the improved microelectronic devices made according to the methods of the invention and to products containing such microelectronic devices.

A still further aspect of the invention relates to methods of manufacturing an article comprising a microelectronic device, said method comprising contacting the microelectronic device with a removal composition for sufficient time to selectively remove a first metal gate material relative to a second metal gate material from the microelectronic device having said material thereon, and incorporating said microelectronic device into said article. The removal composition can comprise, consist of, or consist essentially of at least one fluoride, at least one metal nitride inhibitor, optionally at least one oxidizing agent, optionally at least one surfactant, and at least one solvent. Alternatively, the removal composition can comprise, consist of or consist essentially of at least one metal nitride inhibitor, at least one etchant compound, at least one oxidizing agent, optionally at least one surfactant, and at least one solvent.

Another aspect of the invention relates to an article of manufacture, said article comprising a microelectronic device substrate and a removal composition, wherein the microelectronic device substrate comprises a first metal gate material and a second metal gate material, and wherein the removal composition may be any removal composition described herein. For example, the removal composition can comprise at least one fluoride, at least one metal nitride inhibitor, optionally at least one oxidizing agent, optionally at least one surfactant, and at least one solvent. Alternatively, the removal composition can comprise at least one oxidizing agent, at least one metal nitride inhibitor, at least one etchant compound, optionally at least one surfactant, and at least one solvent.

The features and advantages of the invention are more fully illustrated by the following non-limiting examples, wherein all parts and percentages are by weight, unless otherwise expressly stated.

Example 1

The following compositions were prepared.
Composition A: 0.6 wt % boric acid, 25.0 wt % tripropylene glycol methyl ether, 29.25 wt % tetrahydrofuran alcohol, 0.1 wt % TBA-BF$_4$, 0.56 wt % ammonium bifluoride, 0.015 wt % ATDT, 0.3 wt % TAZ, 44.175 wt % water
Composition B: 4 wt % ammonium hydroxide, 4 wt % $H_2O_2$ (30%), 15 wt % HEDP, 77 wt % water
Composition C: 4 wt % ammonium hydroxide, 4 wt % $H_2O_2$ (30%), 1 wt % boric acid, 91 wt % water
Composition D: 4 wt % ammonium hydroxide, 4 wt % $H_2O_2$ (30%), 1 wt % HEDP, 91 wt % water
Composition E: 4 wt % ammonium hydroxide, 4 wt % $H_2O_2$ (30%), 0.1 wt % boric acid, 91.9 wt % water
Composition F: 4 wt % ammonium hydroxide, 4 wt % $H_2O_2$ (30%), 8 wt % HEDP, 84 wt % water
Composition G: 4 wt % ammonium hydroxide, 4 wt % $H_2O_2$ (30%), 10 wt % HEDP, 82 wt % water
Composition H: 4 wt % ammonium hydroxide, 4 wt % $H_2O_2$ (30%), 2 wt % HEDP, 90 wt % water
Composition I: 4 wt % ammonium hydroxide, 4 wt % $H_2O_2$ (30%), 4 wt % HEDP, 88 wt % water
Composition J: 4 wt % ammonium hydroxide, 4 wt % $H_2O_2$ (30%), 6 wt % HEDP, 86 wt % water
Composition K: 4 wt % ammonium hydroxide, 4 wt % $H_2O_2$ (30%), 0.01 wt % boric acid, 91.99 wt % water
Composition L: 0.6 wt % boric acid, 0.56 wt % ammonium bifluoride, 98.84 wt % water
Composition M: 4 wt % ammonium hydroxide, 4 wt % $H_2O_2$ (30%), 5 wt % HEDP, 87 wt % water
Composition N: 4 wt % ammonium hydroxide, 4 wt % $H_2O_2$ (30%), 92 wt % water A blanketed wafer having a layer of titanium nitride and a blanketed wafer having a layer of tantalum nitride were individually immersed in formulations D, H and I, as well as control formulation N, at 80° C. for 1 minute. The etch rate of each nitride was determined using spectral ellipsometry (SE) and the results tabulated in Table 1.

TABLE 1

Etch rates of TiN$_x$ and TaN$_x$ in removal compositions.

| Formulation | Etch rate TaN$_x$/Å min$^{-1}$ | Etch rate TiN$_x$/Å min$^{-1}$ |
|---|---|---|
| D | 10.47 | 66.01 |
| H | 6.53 | 66.53 |
| I | 2.95 | 66.96 |
| N | 4.03 | 66.24 |

It can be seen that as the amount of HEDP added to the formulation increases (e.g., from formulation D to H to I), the etch rate of TaN$_x$ decreased while the etch rate of TiN$_x$ remained unaffected. It can be seen that formulation I was the most effective at inhibiting the etch rate of TaN$_x$. Although not wishing to be bound by theory, it is thought that as the amount of HEDP present increases and the pH decreases that the activity of the oxidizing agent decreases and hence the etch rate of TaN$_x$ decreases.

A blanketed wafer having a layer of titanium nitride and a blanketed wafer having a layer of tantalum nitride were individually immersed in formulation M, as well as control formulation N, at 40° C. for 3 minutes. The etch rate of each nitride was determined using SE and the results tabulated in Table 2.

TABLE 2

Etch rates of TiN$_x$ and TaN$_x$ in removal compositions.

| Formulation | Etch rate TaN$_x$/Å min$^{-1}$ | Etch rate TiN$_x$/Å min$^{-1}$ |
|---|---|---|
| M | 1.10 (1σ = 0.27 Å) | 63.12 |
| N | 3.25 (1σ = 0.34 Å) | 67.10 |

It can be seen that the presence of HEDP adequately inhibited the etch rate of TaN$_x$.

Although the invention has been variously disclosed herein with reference to illustrative embodiments and features, it will be appreciated that the embodiments and features described hereinabove are not intended to limit the invention, and that other variations, modifications and other embodiments will suggest themselves to those of ordinary skill in the art, based on the disclosure herein. The invention therefore is to be broadly construed, as encompassing all such variations, modifications and alternative embodiments within the spirit and scope of the claims hereafter set forth.

What is claimed is:

1. A method comprising: contacting a substrate comprising a first metal gate material comprising titanium and a second metal gate material comprising tantalum with a removal composition, wherein the removal composition selectively removes the first metal gate material relative to the second metal gate material, wherein the removal composition comprises at least one oxidizing agent present in amount ranging from 0.01 wt. % to less than 10 wt. %, an etchant, and at least one metal nitride inhibitor, wherein the etchant comprises ammonium hydroxide or tetraalkylammonium salts of hydroxide and wherein the at least one metal nitride inhibitor comprises a species selected from the group consisting of boric acid, ammonium borates, ascorbic acid, L(+)-ascorbic acid, isoascorbic acid, ascorbic acid derivatives, gallic acid, 1-hydroxyethylidene-1,1-diphosphonic acid (HEDP),-1-hydroxyethane-1,1-diphosphonic acid, nitrilotris(methylenephosphonic acid) (NTMPA), 1,5,9-triazacyclododecane-N,N',N''-tris(methylenephosphonic acid) (DOTRP), 1,4,7,10-tetraazacyclododecane-N,N',N'',N'''-tetrakis(methylenephosphonic acid) (DOTP), diethylenetriaminepenta(methylenephosphonic acid) (DETAP), aminotri(methylenephosphonic acid), bis(hexamethylene) triamine phosphonic acid, 1,4,7-triazacyclononane-N,N',N''-tris(methylenephosphonic acid (NOTP), esters of phosphoric acids; 5-amino-1,3,4-thiadiazole-2-thiol (ATDT), benzotriazole (BTA), tannic acid, ethylenediaminetetraacetic acid (EDTA), uric acid, 1,2,4-triazole (TAZ), tolyltriazole, 5-phenyl-benzotriazole, 5-nitro-benzotriazole, 3-amino-5-mercapto-1,2,4-triazole, 1-amino-1,2,4-triazole, hydroxybenzotriazole, 2-(5-amino-pentyl)-benzotriazole, 1-amino-1,2,3-triazole, 1-amino-5-methyl-1,2,3-triazole, 3-amino-1,2,4-triazole, 3-mercapto-1,2,4-triazole, 3-isopropyl-1,2,4-triazole, 5-phenylthiol-benzotriazole, halo-benzotriazoles, naphthotriazole, 2-mercaptobenzimidazole (MBI), 2-mercaptobenzothiazole, 4-methyl-2-phenylimidazole, 2-mercaptothiazoline, 5-aminotetrazole, 2,4-diamino-6-methyl-1,3,5-triazine, thiazole, triazine, methyltetrazole, 1,3-dimethyl-2-imidazolidinone, 1,5-pentamethylenetetrazole, 1-phenyl-5-mercaptotetrazole, diaminomethyltriazine, imidazoline thione, mercaptobenzimidazole, 4-methyl-4H-1,2,4-triazole-3-thiol, benzothiazole, tritolyl phosphate, imidazole, indiazole, catechol, pyrogallol, resorcinol, hydroquinone, cyanuric acid, barbituric acid, 1,2-dimethylbarbituric acid, pyruvic acid, adenine, purine, glycine/ascorbic acid, p-tolylthiourea, phosphonobutane tricarboxylic acid (PBTCA), decylphosphonic acid, dodecylphosphonic acid (DDPA), tetradecylphosphonic acid, hexadecylphosphonic acid, bis(2-ethylhexyl)phosphate, octadecylphosphonic acid, perfluoroheptanoic acid, prefluorodecanoic acid, trifluoromethanesulfonic acid, phosphonoacetic acid, dodecylbenzenesulfonic acid, dodecenylsuccinic acid, dioctadecyl hydrogen phosphate, octadecyl dihydrogen phosphate, dodecylamine, dodecenylsuccinic acid monodiethanol amide, lauric acid, palmitic acid, oleic acid, juniperic acid, 12 hydroxystearic acid, octadecylphosphonic acid (ODPA), and combinations thereof.

2. The method of claim 1, wherein the removal composition does not substantially remove other gate stack materials present on the substrate.

3. The method of claim 1, wherein the first metal gate material comprises titanium nitride and the second metal gate material comprises tantalum nitride.

4. The method of claim 1, wherein the at least one oxidizing agent comprises a species selected from the group consisting of ozone, hydrogen peroxide, oxone, oxone tetrabutylammonium salt, ferric nitrate, potassium iodate, iodic acid, periodic acid, potassium permanganate, permanganic acid, chromium (III) oxide, ammonium cerium nitrate, nitric acid, ammonium chlorite, ammonium chlorate, ammonium iodate, ammonium perborate, ammonium perchlorate, ammonium periodate, ammonium persulfate, sodium persulfate, potassium persulfate, tetramethylammonium chlorite, tetramethylammonium chlorate, tetramethylammonium iodate, tetramethylammonium perborate, tetramethylammonium perchlorate, tetramethylammonium periodate, tetramethylammonium persulfate, urea hydrogen peroxide, peracetic acid, and combinations thereof.

5. The method of claim 1, wherein the at least one oxidizing agent comprises hydrogen peroxide.

6. The method of claim 1, wherein the removal composition further comprises at least one acid selected from the group consisting of sulfuric acid, nitric acid, acetic acid, trifluoroacetic acid, and hydrochloric acid.

7. The method of claim 1, wherein the at least one metal nitride inhibitor comprises 1-hydroxyethylidene-1,1-diphosphonic acid.

8. The method of claim 1, wherein the removal composition further comprises at least one surfactant.

9. The method of claim 1, wherein the removal composition is substantially devoid of fluoride.

10. The method of claim 1, wherein the removal composition is substantially devoid of abrasive or other inorganic particulate material, amines, chlorides, metal halides, silicates, and combinations thereof.

11. The method of claim 1, wherein the removal composition further comprises at least one solvent selected from the group consisting of water, methanol, ethanol, isopropanol, butanol, pentanol, hexanol, 2-ethyl-1-hexanol, heptanol, octanol, ethylene glycol, propylene glycol, butylene glycol, butylene carbonate, ethylene carbonate, propylene carbonate, dipropylene glycol, diethylene glycol monomethyl ether, triethylene glycol monomethyl ether, diethylene glycol monoethyl ether, triethylene glycol monoethyl ether, ethylene glycol monopropyl ether, ethylene glycol monobutyl ether, diethylene glycol monobutyl ether, triethylene glycol monobutyl ether, ethylene glycol monohexyl ether, diethylene glycol monohexyl ether, ethylene glycol phenyl ether, propylene glycol methyl ether, dipropylene glycol methyl ether (DPGME), tripropylene glycol methyl ether (TPGME), dipropylene glycol dimethyl ether, dipropylene glycol ethyl ether, propylene glycol n-propyl ether, dipropylene glycol n-propyl ether (DPGPE), tripropylene glycol n-propyl ether, propylene glycol n-butyl ether, dipropylene glycol n-butyl ether, tripropylene glycol n-butyl ether, propylene glycol phenyl ether, 2,3-dihydrodecafluoropentane, ethyl perfluorobutylether, methyl perfluorobutylether, alkyl carbonates, alkylene carbonates, 4-methyl-2-pentanol, dense fluid, and combinations thereof.

12. The method of claim 11, wherein the at least one solvent comprises water.

* * * * *